United States Patent [19]

Sepponen

[11] Patent Number: 4,799,015

[45] Date of Patent: Jan. 17, 1989

[54] METHOD OF MAPPING THE NUCLEAR MAGNETIC PROPERTIES OF AN OBJECT TO BE EXAMINED

[75] Inventor: Raimo Sepponen, Helsinki, Finland

[73] Assignee: Instrumentarium Corp., Finland

[21] Appl. No.: 70,658

[22] Filed: Jul. 7, 1987

Related U.S. Application Data

[63] Continuation of Ser. No. 794,485, Nov. 4, 1985, abandoned.

[30] Foreign Application Priority Data

Nov. 21, 1984 [FI] Finland ................................. 844561

[51] Int. Cl.$^4$ ........................................... G01R 33/20
[52] U.S. Cl. ..................................... 324/314; 128/653; 324/312
[58] Field of Search ................ 324/307, 308, 309, 311, 324/312, 313, 314, 315; 128/653

[56] References Cited

U.S. PATENT DOCUMENTS

| | | | |
|---|---|---|---|
| 4,070,611 | 1/1978 | Ernst | 324/312 |
| 4,110,681 | 8/1978 | Hofer et al. | 324/313 |
| 4,345,207 | 8/1982 | Bertrand et al. | 324/308 |
| 4,563,647 | 1/1986 | Young | 324/309 |

FOREIGN PATENT DOCUMENTS 2056088  3/1981  United Kingdom ................. 324/315

OTHER PUBLICATIONS

W. J. Freeman et al., Automated Nonselective Measurement of T1$\rho$ by Fourier Transform NMR, Rev. Sci. Inst., vol. 47, No. 1, Jan. 1976.
A. O. Goedde et al., A Computer... Relaxation Times, Chemical Inst. vol. 7, No. 3, 1976.
Furushima, E. et al., *Experimental Pulse NMR A Nuts and Bolts Approach*, Addison-Wesley Publishing Co., Inc. 1981.
Knispel, R. R. et al., "Dispersion of Proton Spin-Lattice Relaxation", J. Magn. Reson., vol. 14, 1974.
Abragam, A., *The Principles of Nuclear Magnetism*, Clarendon Press, Oxford.
Slichter, C. P., *Principles of Magnetic Resonance*, 2nd Edition, Springer-Verlag.
Mathur-DeVré, R., "The NMR Studies of Water in Biological Systems", Prog. Biophys. Molec. Biol., vol. 35, 1979.
Redfield, A. G., "Nuclear Magnetic Resonance Saturation and Rotary Saturation in Solids", Physical Review, vol. 98, No. 6, Jun. 15, 1955.
Koenig, S. H. et al., "Magnetic Field Dependence of $1/T_1$ of Protons in Tissue", Investigative Radiology, Mar.–Apr., 1984.
Finch, E. D. et al., "Mobility of Water... Proton NMR Relaxation Study", Biochem. Biophys. Acta. 406, 1975.
Jones, G. P., "Spin–Lattice Relaxation... Weak–Collision Case", Physical Review, vol. 148, No. 1, Aug. 5, 1966.
Ailion, D. C., "NMR and Ultraslow Motions", Advances in Magnetic Resonance, vol. 5, 1971.
Sepponen, R. E., "A Method for $T_{1\rho}$ Imaging", J. Computer Assisted Tomography, 9(6), Nov./Dec., 1985.
Diegel, J. G. et al., "Origin of the Nonexponentiality... Stin Relaxations in Tissues", Biophysical Journal, vol. 15, 1975.

Primary Examiner—Stewart J. Levy
Assistant Examiner—Kevin D. O'Shea
Attorney, Agent, or Firm—Andrus, Sceales, Starke & Sawall

[57] ABSTRACT

The invention relates to a method of mapping the local distribution of $B_1$-dispersion of relaxation tim $T_{1\rho}$ of the nucleus of a certain element, such as hydrogen or phosphorus of an object, such as e.g. a human body or a part of it, or the trunk of a tree. In the method of this invention, an object area is first subjected to a first excitation pulse, which tilts the magnetization of the nuclei of said object area preferably 90° and thereafter to a locking pulse, whose phase and frequency are selected in a manner that relaxation with respect to the magnetic vector of this locking pulse takes place, followed by performing the required procedures by applying per se known nuclear spin imaging methods, and the above sequence of operations is repeated as many times as desired by changing the amplitude of said locking pulse.

24 Claims, 7 Drawing Sheets

METHOD OF MAPPING THE NUCLEAR MAGNETIC PROPERTIES OF AN OBJECT TO BE EXAMINED

The present application is a continuation application of U.S. patent application Ser. No. 06/794,485, filed Nov. 4, 1985, and now abandoned.

The present invention relates to a method of determining the distribution of the dependency of the relaxation time $T_1$ on the strength of the locking field $B_1$, i.e. the $B_1$ dispersion of the relaxation time $T_{1\rho}$ of nuclear magnetism in the nucleus of an atom to be examined in a three-dimensional object, such as a human body or trunk of a tree.

The existence of nuclear magnetic resonance phenomenon (NMR phenomenon) was established experimentally in 1946 by two research groups (Pound, Purcell, Torrey and Bloch, Hansen, Packard). This discovery quickly led to wide application of the phenomenon in the fields of physics and organic chemistry.

BACKGROUND OF THE INVENTION

All nuclei with odd number of protons or neutrons have an impulse moment or spin different from zero. The nuclei also have a positive electric charge which, together with the spin of the nucleus, produces for the nucleus a magnetic moment whose direction coincides with the spin axis of the nucleus. A field generated by the magnetic moment of a nucleus can be approximated by the field of a magnetic dipole. If a sample containing a large number of nuclei is placed in a static magnetic field, the magnetic moments of the nuclei tend to align parallel with and the sample will be provided with a net magnetization parallel to the external magnetic field. The net magnetization is proportional to the number of nuclei in a sample and to the strength of an external magnetic field ($B_o$). The orientation of nuclei is disturbed by the thermal motion of nuclei, so the order of magnetization is also affected by the temperature of a sample. As temperature increases, magnetization decreases. In terms of quantum mechanics, the events can be described so that an external magnetic field generates a number of energy levels depending on the spin quantum number (I) of a nucleus, at which levels a nucleus can set with a certain probability. The nucleus of a hydrogen atom or proton has a spin quantum number $I=\frac{1}{2}$, so a proton can settle at two energy levels either in a manner that the direction of its magnetic moment is the same as that of the external magnetic field or reverse to this direction. Of these two, the former is more probable and the occupation proportions of energy levels conform with the so-called Boltzmann distribution.

In order to move from one energy level to another, a nucleus either receives or delivers an energy quantum as electromagnetic radiation of a certain frequency. The radiation frequency is determined by the difference between energy levels, which is directly proportional to the strength of the external magnetic field $B_o$. This frequency, associated with exchange of energy, is called the Larmor frequency and this exchange of energy between nucleus and environment is called the nuclear magnetic resonance phenomenon. The principles of nuclear magnetic resonance have been dealt with in e.g. the following references: Abragam A.; The Principles of Nuclear Magnetism. London Oxford University Press., 1961 and Slichter C. P.; Principles of Magnetic Resonance, Berlin, Springer Verlag, 1981.

The nuclear magnetic resonance phenomenon has been studied by so-called continuous radiation (CW, Continuous Wave) and pulse methods. Pulse methods have been found more effective than CW-methods and are thus employed in NMR-spectroscopy and so-called nuclear spin imaging.

In pulse methods, a sample is subjected to an electromagnetic pulse of Larmor frequency, whose duration is determined in a manner that the nuclear magnetization of a sample tilts through a desired angle ($\theta$) relative to the direction of an external magnetic field. The amplitude and duration of an electromagnetic pulse are generally selected in a manner that ($\theta$) is a multiple of 90°. Generally used terms are 90° and 180° pulses etc. The net magnetization Mn deflected from the direction of a basic magnetic field $B_o$ after the act of excitation precesses at the Larmor frequency $W_o$ around the direction of $B_o$. This can be established by placing a coil outside a sample in a manner that its magnetic axis is orthogonal to the direction of $B_o$. The precessing net magnetization induces in the coil a so-called FID-signal (Free Induction Decay), which oscillates at Larmor frequency and whose amplitude is proportional to the strength of the nuclear magnetization of the sample and to the strength of the external magnetic field $B_o$.

The pulse methods associated with nuclear magnetic resonance tests have been described e.g. in the following references: Farrar T. C., Becker E. D.; Pulse and Fourier Transform NMR—Introduction to Theory and Methods. New York, Academic Press, 1971 and Ernst R. R., Anderson W. A.; Application of Fourier Spectroscopy to Magnetic Resonance, Rev Sci Instrum, Vol. 37, No 1, 1966.

During the excitation, a nuclear system receives external energy from an exciting radio-frequency field and, after the excitation, delivers it to its environment. The delivery of energy may occur as coherent radiation that can be detected by means of an external coil or the energy may be absorbed by the molecular structure of the sample. In connection with the delivery of energy, the net magnetization of a sample returns to its equilibrium value. The nature of this process is exponential and characterized by a relaxation time $T_1$. This relaxation time is dependent on the composition of a substance to be examined, e.g. with liquid substances $T_1$ is relatively short (milliseconds to seconds), while with solid substances, $T_1$ is long (minutes to weeks).

The coherence of radiation emitted by a sample declines after excitation at a rate determined e.g. by the properties of a substance to be examined and by the homogeneity of the external magnetic field $B_o$. This results in exponential decay of a signal at a rate characterized by a relaxation time $T_2^*$ ($T_2$ asterisk or star).

$$1/T_2^* = 1/T_2 + \gamma \Delta B_o/(2\pi), \quad (1)$$

wherein
  $T_2$ is the spin-spin relaxation time of a sample
  $\gamma$ is a gyromagnetic ratio
  $\Delta B_o$ is the inhomogeneity of the polarizing magnetic field over a sample The relaxation time $T_{1\rho}$ is analogous to $T_1$ longitudinal relaxation time and is the longitudinal relaxation time in a rotating frame of reference. This frame of reference rotates around the z' axis at the Larmor angular speed. The z' axis coincides to the z axis of the conventional frame of reference xyz. The main magnetic field $B_o$ is directed along the z' axis. The effective static field due to the magnetic field $B_o$ in the rotating frame of reference is zero. The magnetic component of the RF exciting field appears as a static field along the x' axis.

In the $T_{1\rho}$ technique, the nuclear magnetization $M_o$ is tilted 90° from the direction of the main magnetic field Bo by a RF pulse. Thereafter, a RF field which has a magnetic component along the tilted magnetization is applied (locking field, $B_1$). The magnetization of the spin system is now locked by the RF field. The magnetization relaxes towards the thermal equilibrium value which corresponds to the strength of the magnetic component of the locking field. Because the magnetic component of the locking field is much smaller than the polarizing magnetic field $B_o$, this equilibrium value is approximately zero. $T_{1\rho}$ is sensitive to low frequency processes and $T_1$ is sensitive to processes which are at higher frequency. Because these processes are mainly due to the thermal movements, there exists a higher efficiency at lower frequencies than at higher frequencies and therefore $T_{1\rho} \leq T_1$.

All the above relaxation times are dependent on the immediate environment of nuclei and its activity. As pointed out above, the physical state of a sample has an effect on relaxation times but also the strength of an external magnetic field and temperature of a sample change relaxation times.

The usefulness of the nucleus of a hydrogen atom or the proton in medical diagnostics is based on the abundance of hydrogen in soft tissues, in which it is primarily bound to water molecules. By virtue of its polarity, in turn, a water molecule links itself in various ways to different protein chains and this linkage is altered for a plurality of reasons, e.g. due to a pathological process.

Relaxation times and their variations have been dealt with in e.g. the following references:

R. Damadian US Pat. No. 3,789,832 and Nuclear Magnetic Resonance of Intact Biological Systems, Phil Trans R Soc Lond., 289, June 1980. R. Mathur de Vré; Progress in Biophysics and Molecular Biology, Vol. 35, 103–104, 1979.

Interest in utilizing the nuclear magnetic resonance phenomenon in medicine rose in the early 1970s. That was when R. Damadian published his research results, revealing that the relaxation time $T_1$ of a malignant tumour tissue is even twice as long as that of a corresponding normal tissue. The publication R. Damadian U.S. Pat. No. 3,789,832 discloses a method for identification of a malignant tumour tissue by comparing the measured relaxation of a tissue with tabulated relaxation time values and then diagnosing possible malignancy of a sample.

However, later studies have indicated that the variation of relaxation times is not specific to any particular pathological condition. It can be generally concluded, however, that relaxation times change readily due to various ailments and can thus be applied in medical diagnostics.

The publication U.S. Pat. No. 3,789,832 also discloses a kind of scanning apparatus for the examination of a human body by means of NMR. However, this prior art solution cannot be regarded as any nuclear magnetic resonance imaging apparatus. The basic idea of nuclear magnetic resonance imaging was published by P. C. Lauterbur in 1973 in his reference P. C. Lauterbur; Nature, 242 190, 1973. In this publication, he also brought up the idea of mapping a relaxation time $T_1$. Several pulse sequences have been developed for measuring relaxation times, including so-called Saturation Recovery and Inversion Recovery sequences for measuring $T_1$ and Spin-Echo sequence for measuring $T_2$. These sequences have been described e.g. in the reference: Farrar T. C., Becker E. D.; Pulse and Fourier Transform NMR—Introduction to Theory and Methods, Academic Press, New York, 1971.

The nuclear magnetic resonance imaging methods can be roughly classified in three categories: 1. Point scanning, 2. Line scanning and 3. Volume scanning methods. In point scanning techniques, an object area to be examined is mapped by moving the object or a point-shaped NMR sensitive area, obtained by various technical means, with respect to each other. The main disadvantage of single point techniques is that they are slow and, therefore, they are not applied in medical imaging. With special arrangements, however, the point scanning methods can be used to obtain more tissue information than e.g. with whole volume scanning methods. The single point scanning techniques have been described in the references: Tanaka et al: Proc. IEEE, Vol. 66, No. 11, 1582–1583, 1978, Damadian: Offenlegungschrift 2946847, Moore et al: U.S. Pat. Nos. 4,015,196, Abe: 3,932,805, Garroway et al: 4,021,726, Crooks et al: 4,318,043, Young: UK Patent Appln. GB No. 2122753 A.

By combining the slow single point scanning technique and rapid ultrasonic imaging technique, as set forth in the reference Sepponen; FI Pat. No. 64282, the single point scanning techniques can be utilized in medical diagnostics.

Line scanning techniques have been described e.g. in the following references: Moore et al: U.S. Pat. No. 4,015,196, Sepponen: FI Pat. No. 58868, Garroway et al: U.S. Pat. Nos. 4,021,196, Crooks et al: 4,318,043, Hutchinson et al: 4,290,019. The line scanning methods are also too slow for medical imaging and, thus, their application is restricted to certain special cases.

Imaging of a three-dimensional object is most preferably effected by applying whole volume scanning techniques. By means of so-called selective excitation, it is possible to define the object area to be examined and to effect more accurate mapping of the distribution of NMR parameters.

Selective excitation can be performed by exciting over the object a magnetic field gradient orthogonal to the plane of an object area to be excited and by modulating an exciting radio-frequency pulse in a manner that its frequency band width and the gradient field strength correspond to the width of a desired object area. Another method of defining an object area is to employ an oscillating magnetic field gradient, as in the reference: Moore et al: U.S. Pat. No.4,015,196. It is also known to utilize a gradient in an exciting radio-frequency pulse in a manner that on successive times of excitations the gradient direction is changed, a stable NMR signal being only generated in the plane where the pulse amplitude is constant.

A considerably more inaccurate method is to utilize the geometrical properties of transmitter and receiver coils for defining an object area and, thus, this method has only been applied when it is desired to make NMR spectroscopic studies of the object. The application of this method has been described in the references: Ackerman et al: Nature 283, 167, 1980, Haase et al: J. Magn. Reson. 56, 401–412, 1984, Bottomley et al: Radiology, 150, 441–446, 1984.

Whole volume imaging methods have been described e.g. in references: Lauterbur; Nature, 242, 190–191, 1973, Ernest; 4,070,611, Hutchison et al; International Patent Application No. WO 81/02788, Sepponen; FI Appln. No. 824343. For speeding up the imaging process, it is possible to apply methods described in references: Edelstein et al: GB Application No. 2079463, Mansfield; U.S. Pat. No. 4,165,479, Hinshaw; Physics Letters 48A, No. 2, June 3, 87–88, 1974, Likes; U.S. Pat. No. 4,307,343.

Particularly noteworthy nuclear spin imaging methods are so-called Fourier imaging methods, one version of which has been set out in the reference Ernst: U.S. Pat. No. 4,070,611. A drawback in this cited method is the collection of an FID signal generated after the excitation pulse. Encoded in the phase of a collected FID signal is the position information of one or two perpendicular directions by means of gradient pulses of constant amplitudes but varying durations. A drawback in this method is e.g. that the signal collection period changes on various signal collection events, resulting in the method's sensitivity to the inhomogeneities of the polarizing magnetic field $B_o$. Also the $T_2$ of a sample affects the signal to be collected.

The reference Hutchison et al: WO 81/02788 discloses a variation of Fourier imaging technique for generating a sort of spin echo by changing the direction of the magnetic field gradient. This spin echo is stored and in its initial phase is encoded the position information by means of a gradient pulse orthogonal to the direction of a read-out gradient, the amplitude of said gradient pulse being varied on various repetition cycles. A more preferred way of generating a spin echo is to utilize a so-called 180° refocusing pulse which is capable of compensating the effect of the basic field inhomogeneities on a final image. Applications of this method have been described in references: Edelstein et al: EP 91008, Bottomley et al: EP 98426, Hutchison et al: Proceedings of 18th Ampere Congress, Nottingham, 1974, 283–284 and Sepponen: FI Appln. No. 824343 corresponding to U.S. Pat. No. 4,654,594 of March 31, 1987.

The reference Brunner P.: Journal of Mag. Res. 33, 83–106 (1979) discloses how to speed up the examination of a three-dimensional object with nuclear spin imaging techniques by directing the excitation and detection phases successively to various parts of an object. This serves to reduce the total examination time.

At present, nuclear magnetic resonance imaging is primarily used for mapping the hydrogen distribution of an object and the distributions of relaxation times $T_1$ and $T_2$ of the nucleus of a hydrogen atom. On the other hand, methods applicable for the mapping of relaxation time $T_{1\rho}$ have not been published. An explanation to this may be that a strong radio-frequency pulse required in the methods for relaxation time $T_{1\rho}$ measurements. The duration of the pulse is relatively long (several hundred milliseconds for biological tissues). At generally used operating frequencies of imaging equipment, this would lead to the absorption of radio-frequency power in the tissues of a person or test animal to be examined, which may result in local temperature rises and provide a health hazard.

However, nuclear spin imaging can be effected with relatively low field strengths (below 0.05T), the employed radio frequency being below 2 MHz and, as known in the art, at frequencies this low the radio-frequency electromagnetic power absorbance in body tissues is low.

One method of mapping the $T_{1\rho}$ distribution of an object has been set out in the reference Sepponen FI Appln. No. 842292, corresponding U.S. patent application Ser. No. 06/738,850, filed May 29, 1985, now abandoned. However, measurement of the relaxation in the locking field can be used to obtain considerably more information than provided by merely mapping the numerical value of distribution of relaxation time $T_{1\rho}$. The reference R. R. Knispel et al: Dispersion of Proton Spin-lattice Relaxation in Tissues, J. Magn. Reson. Vol. 14, 44–51, 1974 has described the dependencies of relaxation times $T_1$, $T_2$ and $T_{1\rho}$ on the strengths of a polarizing magnetic field $B_o$ and an irradiating locking field $B_1$. Hereinbelow, the dependence of relaxation time $T_{1\rho}$ on the strength of an irradiating locking field $B_1$ will be called the $B_1$-dispersion of $T_{1\rho}$. An image of the local distribution of $B_1$-dispersion of $T_{1\rho}$ formed of an object is called the $B_1$-dispersion map of $T_{1\rho}$.

The relaxation rates of the proton resonance of body tissues are primarily affected by three mechanisms: The exchange of protons between water molecules, rotation and diffusion of water molecules. Thus, the total relaxation rate of speed is the sum of these three factors $$R_{Total} = R_{ex} + bR_{rot} + (1-b)R_{diff}$$

Relaxation rates are dependent on the magnetic field strength in which relaxation occurs. Thus, $R_{ex}$ depends on the strength of an exciting magnetic field $B_1$ and also on the strength of a polarizing magnetic field. $R_{rot}$ depends on the strength of a polarizing magnetic field.

$R_{diff}$ does not essentially depend on the strength of magnetic fields. These dependencies vary between different tissues and, thus, it is possible to characterize tissues by means of the dispersion of relaxation times. Relaxation time $T_2$ does not essentially depend on the strength of a polarizing field but, instead, relaxation time $T_1$ possesses a clear field dependency.

SUMMARY OF THE INVENTION

A method of the invention can be naturally applied by using greater field strengths, if permitted by the object to be examined. Thus, the method can be combined with imaging methods which provide the local distribution of the NMR spectrum of an object. Such methods have been described e.g. in references U.S. Pat. No. 4,319,190, GB No. 2057142, Journal of Magnetic Resonance Vol. 40, p. 209, 1980, FI Appln. No. 832,326 and FI Appln. No. 33,807 (corresponding to U.S. Pat. No.4,654,595 of Mar. 31, 1987), Journal of Magnetic Resonance, Vol. 59, p. 536, 1984, FI Pat. No. 65869. This way it is possible to map the local distribution of the $B_1$ dispersion of $T_{1\rho}$ of each chemical compound.

In order to produce the $B_1$-dispersion map of $T_{1\rho}$ of an object, the excitation procedure and imaging sequence must be repeated several times by using e.g. the locking field strengths corresponding to resonance frequencies of 1, 5, 10 and 50 kHz. The values preferable in diagnostics are perhaps 2 and 20 kHz. If then the duration of a locking pulse is in each case a constant $\rho$, a signal with intensity distribution I will be obtained according to formula (2):

$$I(x,y,z,B_1(n)) = I(x,y,z)exp(-\tau/T_{1\rho}(x,y,z,B_1(n))) \quad (2)$$

wherein $I(x,y,z,B_1(n))$ = signal intensity of an object element at location x,y,z and measured with the strength of the locking field $B_1 1 (n)$ $\tau$ is the duration of a locking pulse I(x,y,z) is the signal intensity without a locking pulse Determination of the field dependency or dispersion of relaxation time $T_{1\rho}$ is very difficult with kind of equipment suitable e.g. for the examination of a human body. The strength of a polarizing field should be changed at least by the ratio 1:10, which would correspond to the change of resonance frequency at the same ratio. The rate of change exceeds safety limits, which e.g. in the USA is 3 Teslas/sec. Changing of a polarizing field would require the re-tuning of transmitter and receiver coils, calibration of the amplitude of excitation pulses and etc. and is therefore highly inconvenient.

A method of the invention can be applied to characterize the material properties of an object to be examined by means of the $B_1$-dispersion of $T_{1\rho}$. By means of this method, it may be possible e.g. in medical imaging to distinguish a fatty tissue from other tissues, whose emitted signal originates from the protons of water. This is useful e.g. in the studies of certain liver diseases and in observation and diagnostics of breast cancer. Distinguishing fat and other tissue is also possible by means of proton spectroscopy, as described in reference Sepponen FI Pat. No. 833,807 corresponding to U.S. Pat. No. 4,654,595, but this requires an apparatus whose polarizing magnetic field has a strength of more than 0.15T. A method of the invention only requires a magnetic field of 0.01 ... 0.02 T.

The lower field strength is of course a lot easier to realize and thus the equipment will be cheaper and provides a possibility of developing an apparatus that can be especially designed for breast cancer diagnostics and the scanning studies. An advantage in the method is the elimination of the use of non-ionizing radiation.

The essential features of the invention are set forth in the main claim and other characterizing features of the invention in the subclaims.

Description of the Drawings

Operation of the invention is illustrated in the accompanying drawing, in which.

DESCRIPTION OF THE ILLUSTRATED EMBODIMENT

Figure 1:
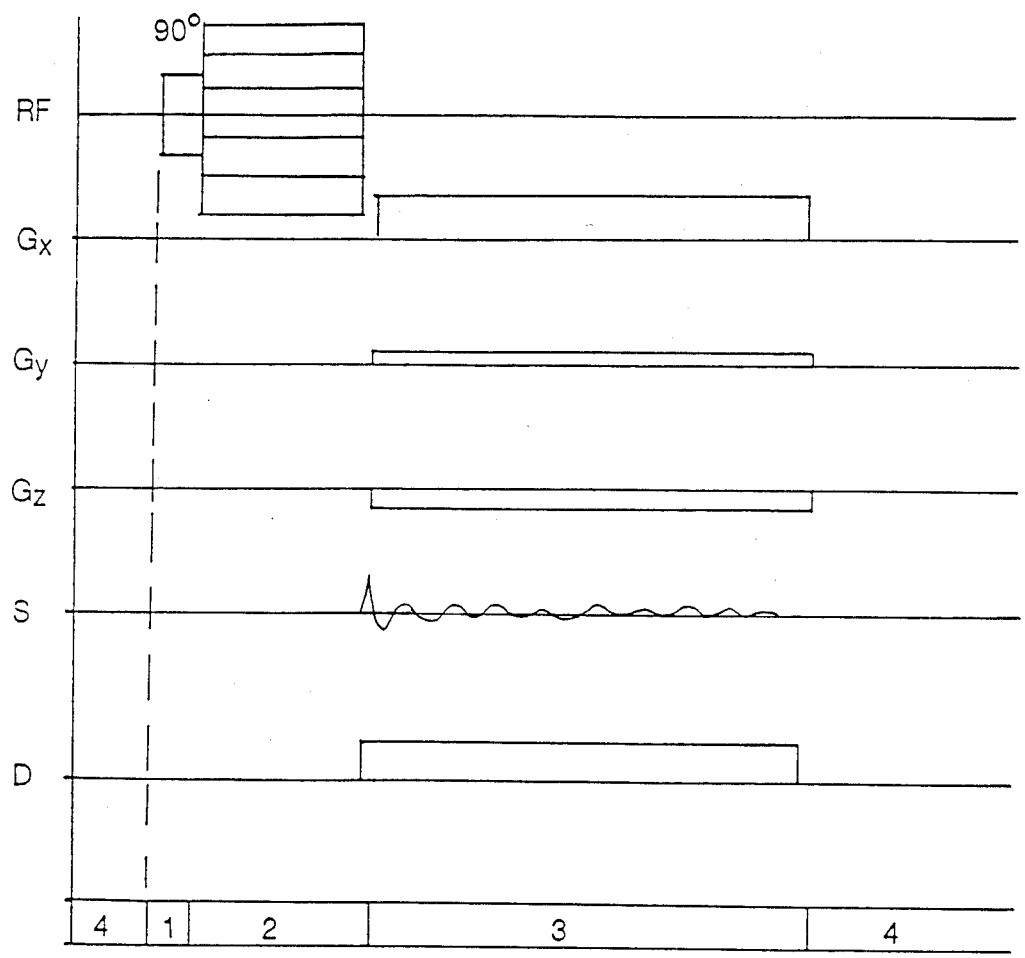
FIG. 1 shows a pulse sequence of the invention for producing an image of a three-dimensional object by using a projection-reconstruction method.

In FIG. 1 during phase 1, the nuclei of an object area are excited preferably by means of a so-called 90° pulse. This pulse can also be an adiabatic half passage pulse. Thereafter, the object area is subjected to a locking pulse (phase 2), whose amplitude is selected in a manner that the relaxation processes occurring during the pulse are weighted as desired and whose duration is selected in a manner that a desired amount of relaxation takes place. The relative time of these pulses is marked on the RF-axis. During phase 3, a read-out gradient is applied to the object area, produced as a resultant of three orthogonal gradients $G_x$, $G_y$ and $G_z$ and whose direction and amplitude can be changed by changing these components. A signal S induced from the object area is picked up during phase 3, the collection period being shown on axis D. During phase 4, the nuclear magnetization of the object area relaxes at a rate determined by relaxation time $T_1$ of the object area. After this, the above described pulse sequence is repeated as many times as desired, e.g. 64 ... 128 times in a two-dimensional case and 4096 ... 16384 times in a three-dimensional case. The imaging process is then repeated as many times as desired by changing the amplitude of said locking pulse in a manner that the weighing of relaxation processes changes as desired and the obtained relaxation maps can be used to produce a map of the $B_1$-dispersion of relaxation time $T_{1\rho}$.

Figure 2:
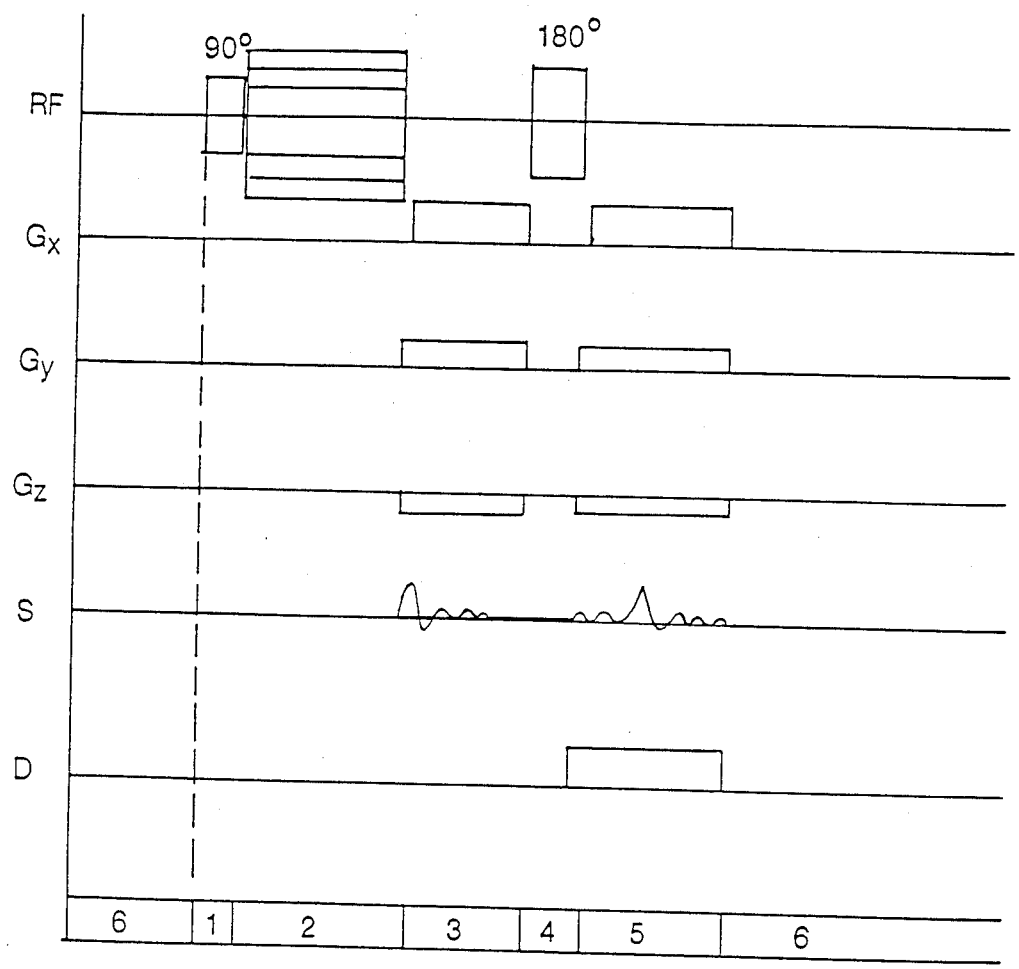
FIG. 2 illustrates application of the invention by using a projection-reconstruction method and by collecting a spin echo generated by means of a refocusing pulse.

The application of the invention shown in FIG. 2 is otherwise the same as that shown in FIG. 1 except that a signal is collected by generating a spin echo by means of a refocusing pulse.

Figure 3:
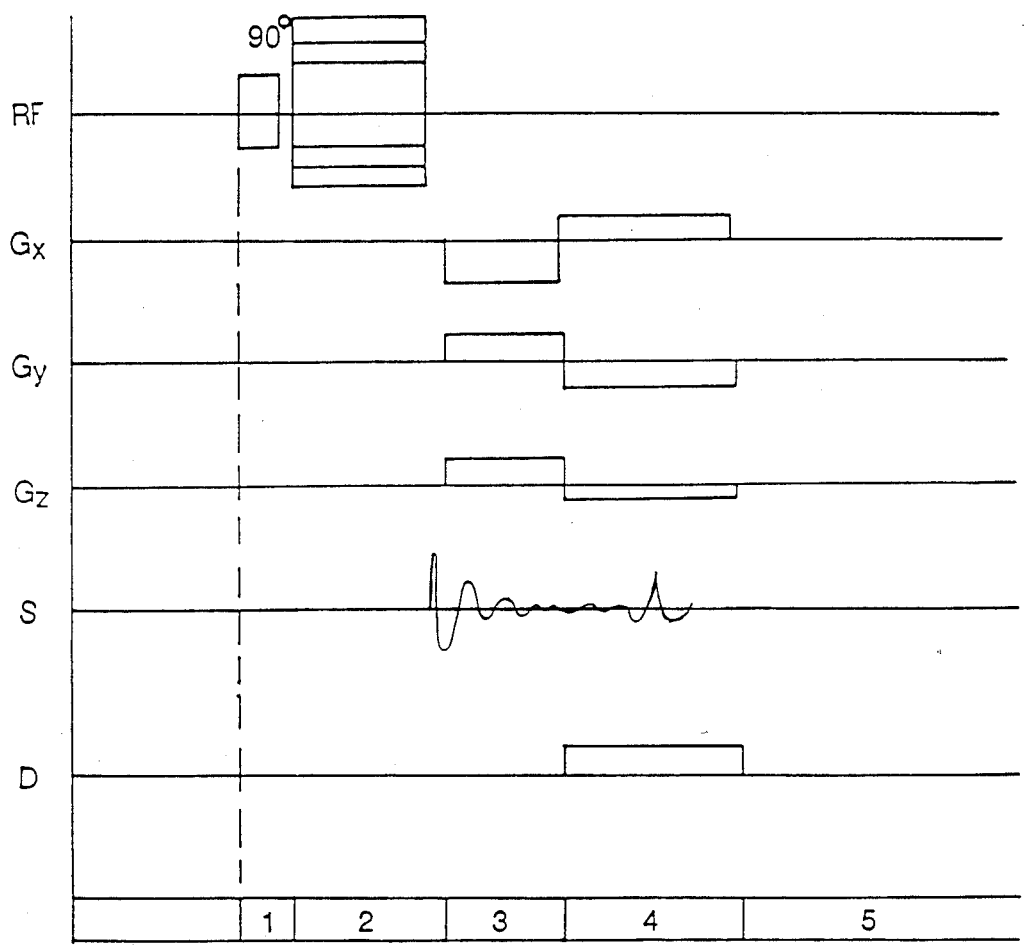
FIG. 3 illustrates application of the invention by using a projection-reconstruction method and by collecting a spin echo generated by reversing a gradient field.

The application of the invention shown in FIG. 3 is otherwise the same as that shown in FIG. 1 except that a signal is collected by generating a spin echo by reversing the direction of a gradient field.

Figure 4:
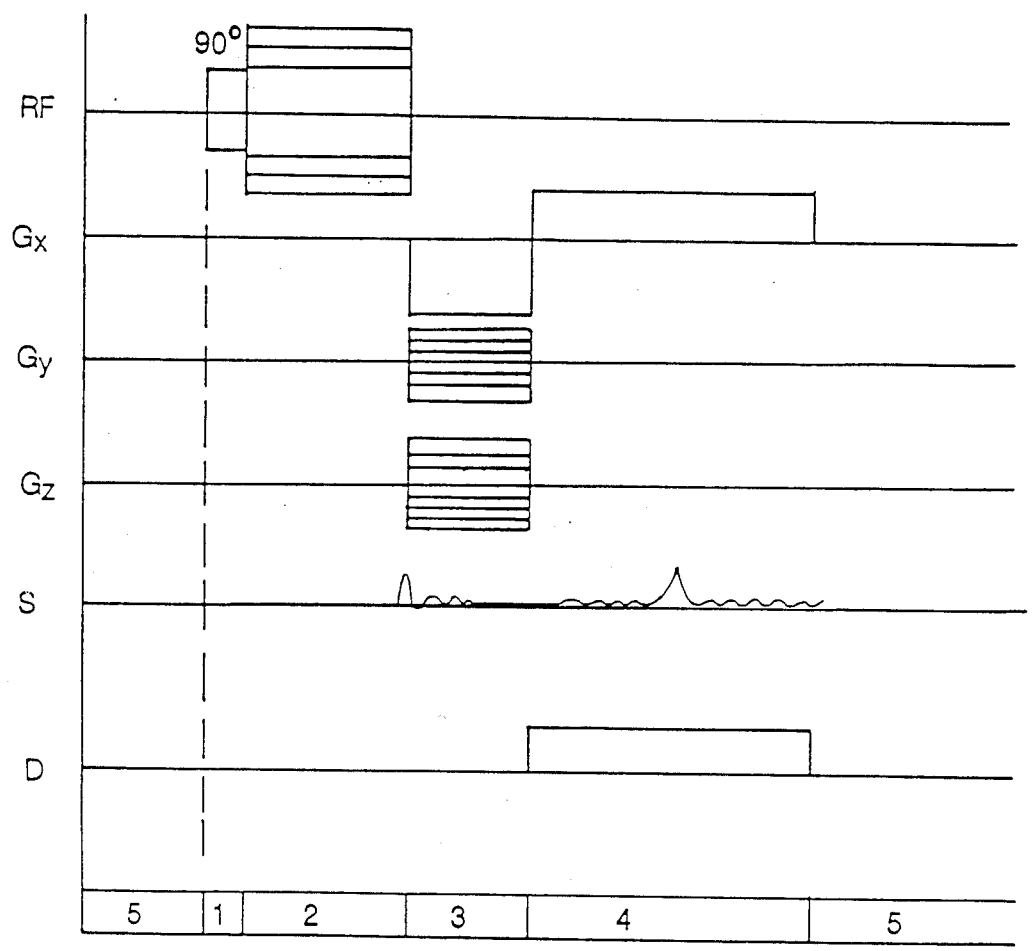
FIG. 4 illustrates application of the invention by using a Fourier method and by collecting a spin echo generated by reversing a gradient field.

FIG. 4 depicts a method of the invention as applied in connection with a Fourier method. In the illustrated case, a signal is picked up by generating a gradient field ($G_x$ in the figure) and the position information in other orthogonal directions is encoded in the phase of a spin echo by means of gradient pulses $G_y$ and $G_z$ (phase 3). When repeating, the time integrals of said gradient pulses are changed.

Figure 5:
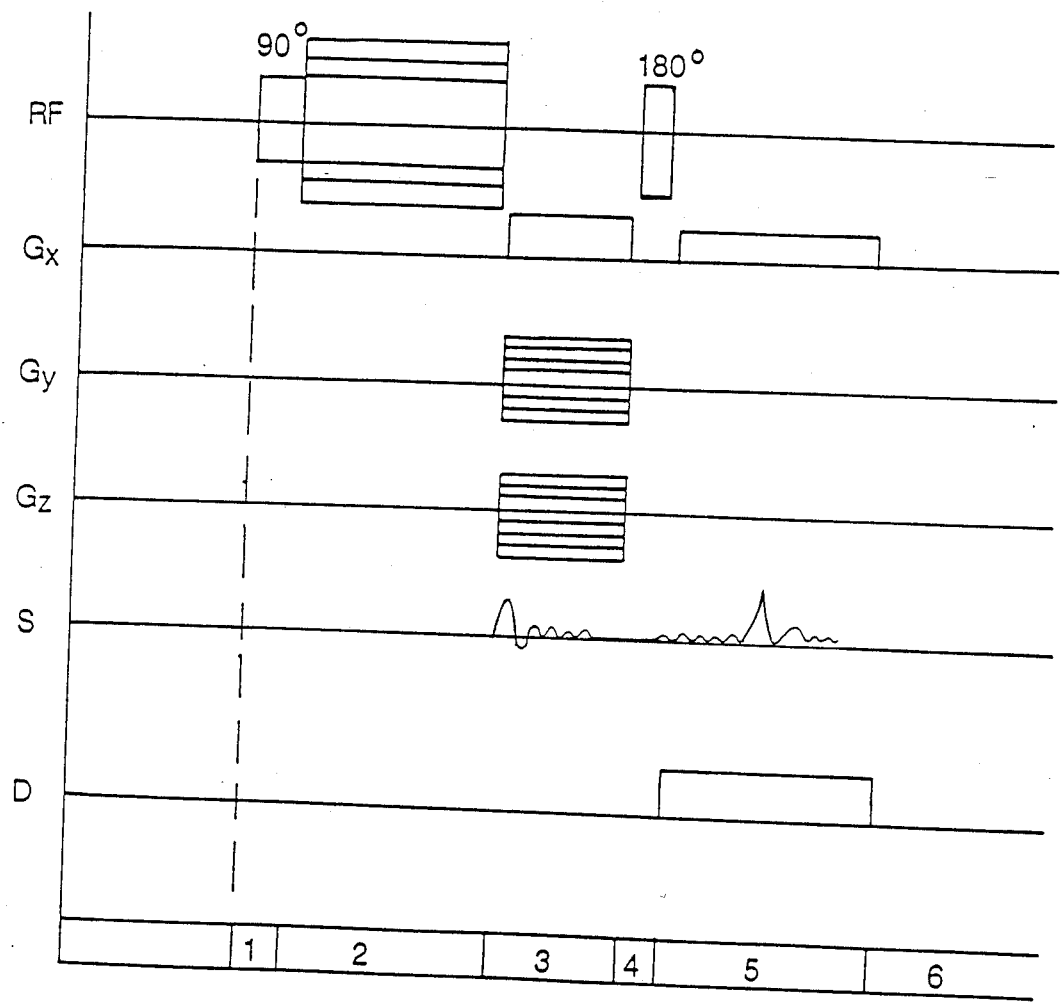
FIG. 5 illustrates application of the invention by using a Fourier method and by collecting a spin echo generated by means of a refocusing pulse.

FIG. 5 presents an application of the method by utilizing a Fourier method and a spin echo generated by means of a refocusing pulse (phase 4) but otherwise the operation is the same as that explained in connection of FIG. 4.

Figure 6:
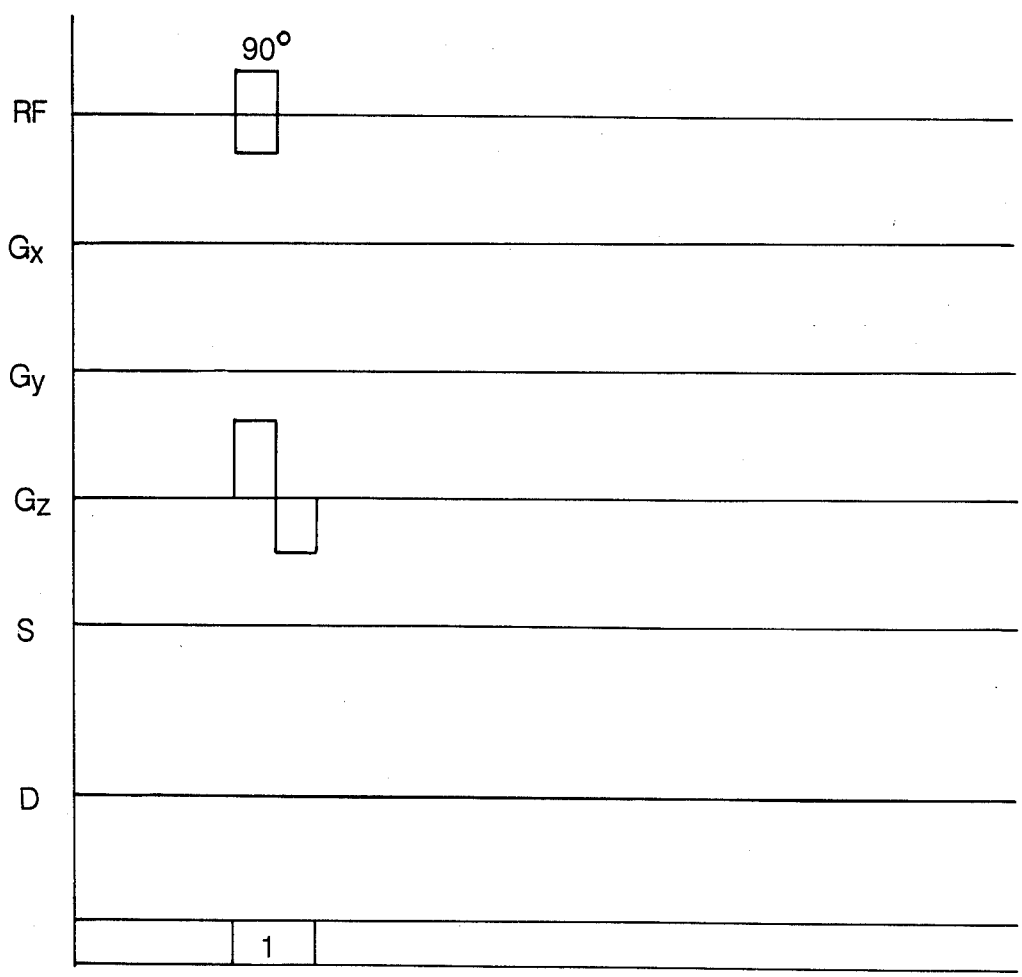
FIG. 6 shows one way of generating a selective excitation pulse that can be applied in connection with the invention.

FIG. 6 illustrates one way of producing a selective excitation pulse that can be applied in connection with all the above-described alternative embodiments. Selected as an example is Z-direction, against which an orthogonally exciting area is created. A dephasing created in connection with excitation is eliminated by reversing the direction of a gradient.

Figure 7:
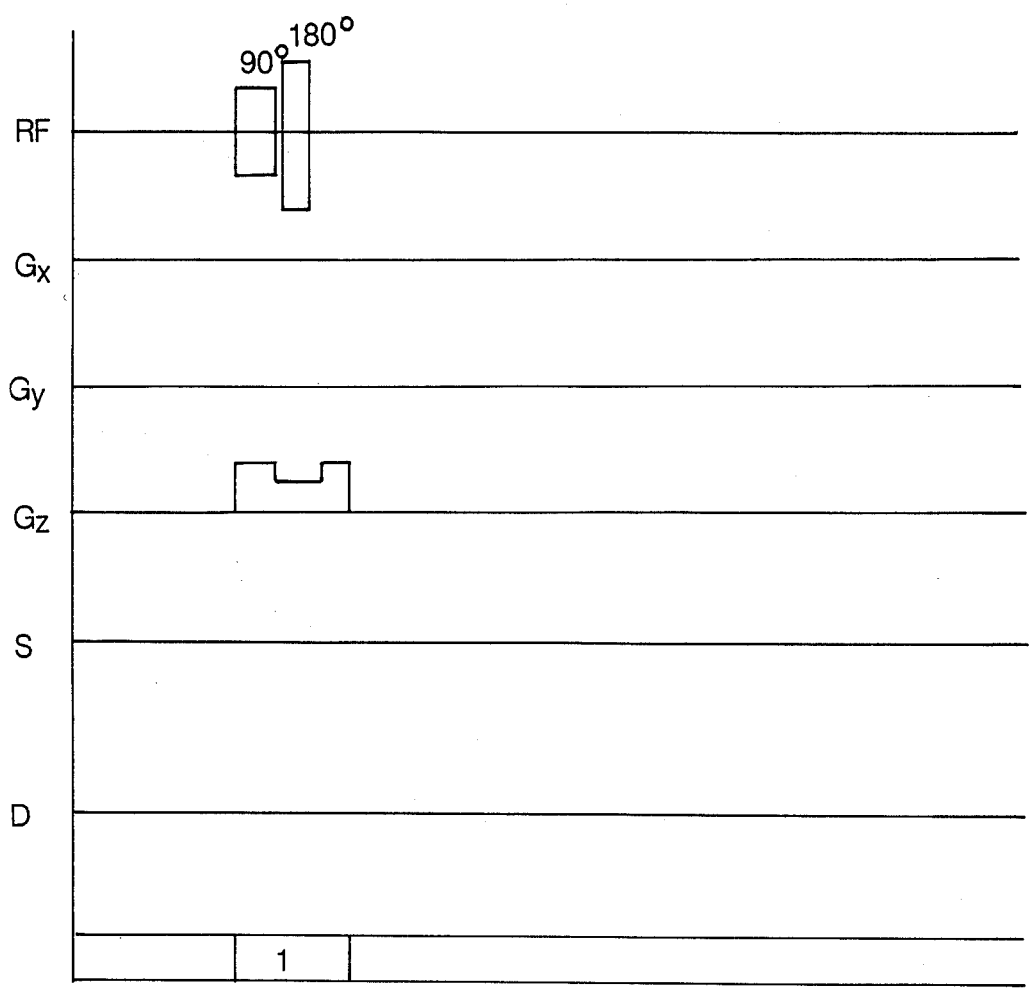
FIG. 7 shows another way of generating a selective excitation pulse that can be applied in connection with the invention.

FIG. 7 illustrates another possible way of producing a selective excitation pulse. A dephasing created in connection with excitation is eliminated by means of a refocusing pulse, followed by switching on a slice selection gradient for a certain period of time so as to remove the dephasing.

The procedures of FIGS. 6 and 7 can be performed in phase 1 in connection with all alternatives shown in FIGS. 1 ... 5.

The invention is not limited to the above applications as other applications are also conceivable. The target nucleus can of course be any nucleus suitable for NMR tests, such as NMR active isotopes of e.g. hydrogen, phosphorus, sodium, fluorine and carbon. In connection with the method, it is possible to use various substances having an effect on relaxation processes for improving diagnostic sensitivity. The method can be applied e.g. to monitoring tissue temperature in connection with hyperthermal treatment.

The method can also be applied in connection with a so-called Inversion Recovery sequence for obtaining a $T_1$-weighing. A similar effect can also be produced by reducing the sequence repetition interval and a $T_2$-weighing can be obtained by increasing a delay between excitation and signal collection. These timings can be changed in a manner that a produced map emphasizes certain material properties of an object more than others.

I claim:

1. A method for mapping the local distribution of the dependence of the relaxation time $T_{1\rho}$ of nuclei of a selected element in an object on the strength of a locking field $B_1$, termed the $B_1$-dispersion of the relaxation time $T_{1\rho}$, said nuclei having magnetic properties, said method comprising the steps of:
    applying a main magnetic field $B_o$ to the nuclei of the area of the object being examined;
    subjecting the object to an excitation pulse which tilts the magnetization of the nuclei from the direction of the main field $B_o$;
    applying a locking pulse $B_1$ of given magnitude to the object, said locking pulse having a magnetic component with a constant phase difference with respect to the tilted magnetization of the nuclei and under which the relaxation process characterized by the relaxation time $T_{1\rho}$ occurs;
    applying a suitable magnetic resonance imaging method for obtaining relaxation time $T_{1\rho}$ data; and
    repeating the foregoing steps with different magnitudes of the locking pulse $B_1$ for obtaining $B_1$-dispersion of the relaxation time $T_{1\rho}$ data.

2. The method according to claim 1 further defined as subjecting the object to an excitation pulse which tilts the magnetization of the nuclei 90° from the direction of the main field $B_o$.

3. The method according to claim 1 further defined as applying projection reconstruction methods of nuclear magnetic resonance imaging.

4. The method according to claim 1 further defined as applying Fourier methods of nuclear magnetic resonance imaging.

5. A method according to claim 1 further defined as subjecting the object to an excitation pulse comprising an adiabatic half passage pulse.

6. The method according to claim 1 wherein said excitation pulse is a selective exitation pulse applied in conjunction with the application of a magnetic field gradient for the main magnetic $B_o$ and including the step of eliminating associated dephasing of the nuclear magnetism.

7. The method according to claim 6 wherein the dephasing is eliminated by reversing the direction of the magnetic field gradient.

8. The method according to claim 6 wherein the dephasing is eliminated by applying a refocusing pulse to the nuclei and altering the magnetic field gradient.

9. The method according to claim 6 wherein in the nuclear magnetic resonance imaging, a second magnetic field gradient having a predetermined strength and direction is applied to the area being examined and a nuclear magnetic resonance signal is collected from the object; wherein the method steps are repeated while changing the direction of the second magnetic field gradient to obtain information about the spatial distribution of the nuclei; and wherein said method includes the steps of producing nuclear density distribution maps of the object containing data regarding the relaxation process occurring under various magnitudes of the locking pulse; and producing a $B_1$- dispersion map of the relaxation time $T_{1\rho}$ from said nuclear density distribution maps.

10. The method according to claim 9 wherein said nuclear density distribution maps are produced by means of projection-reconstruction methods.

11. The method according to claim 9 wherein repeating the method steps with different amplitudes of the locking pulse is carried out first and wherein repeating the method steps with different directions of the additional magnetic field gradient is carried out thereafter.

12. The method according to claim 9 wherein repeating the method steps with different directions of the second magnetic field gradient is carried out first and wherein repeating the method steps with different amplitudes of the locking pulse is carried out thereafter.

13. The method according to claim 6, wherein in the nuclear magnetic resonance imaging, a second field gradient having a predetermined strength and direction is applied to the area being examined; wherein a spin echo is created and a spin echo signal is collected from said object; wherein the method steps are repeated while changing the direction of said second magnetic field gradient to obtain data regarding the $B_1$-dispersion of the relaxation time $T_{1\rho}$ ; and wherein said method includes the steps of producing nuclear density distribution maps of the object containing data regarding the relaxation process that has occurred under the influence of various magnitudes of the locking pulse; and producing a $B_1$- dispersion map of relaxation time $T_{1\rho}$ from said nuclear density maps.

14. The method according to claim 13 wherein repeating the method steps with different amplitudes of the locking pulse is carried out first and wherein repeating the method steps with different directions of the second magnetic field gradient is carried out thereafter.

15. The method according to claim 13 wherein repeating the method steps with different directions of the second magnetic field gradient is carried out first and wherein repeating the method steps with different amplitudes of the locking pulse is carried out thereafter.

16. The method according to claim 13, wherein said spin echo is created by reversing the direction of the second magnetic field gradient.

17. The method according to claim 13 wherein said spin echo is created by applying a refocusing pulse to the nuclei while altering the second magnetic field gradient.

18. The method according to claim 12 wherein the nuclear density distribution maps are produced by means of projection-reconstruction methods.

19. The method according to claim 6 wherein in the nuclear magnetic resonance imaging, a second field gradient having a predetermined strength and direction is applied to the area being examined; wherein a spin echo signal is created; wherein an additional magnetic field gradient is applied to the area being examined, the time integral of the additional magnetic field gradient having a predetermined value at least prior to the elimination of the dephasing; wherein the spin echo signal is collected; wherein the method steps are repeated while changing the time integral of the additional magnetic field gradient in order to obtain data regarding spatial distribution of the nuclei; and wherein said method includes the steps of producing nuclear, density distribution maps of the object containing data about the relaxation process occurring under the influence of various amplitudes of said locking pulse; and producing a $B_1$ distribution map of relaxation process $T_{1\rho}$ from said nuclear density maps.

20. The method according to claim 19 wherein said nuclear density distribution maps are produced by a Fourier method.

21. The method according to claim 19 wherein repeating the method steps with different amplitudes of the locking pulse is carried out first and wherein repeating the method steps with different directions of the additional magnetic field gradient is carried out thereafter.

22. The method according to claim 19 wherein repeating the method steps with different directions of the second magnetic field gradient is carried out first and wherein repeating the method steps with different amplitudes of the locking pulse is carried out later.

23. The method according to claim 1 further defined as one for mapping the $B_1$-dispersion of the relaxation time $T_{1\rho}$ in elements comprising one of hydrogen and phosphorous.

24. The method according to claim 1 further defined as one for mapping the $B_1$-dispersion of the relaxation time $T_{1\rho}$ in an object comprising the human body or a portion thereof.

* * * * *